United States Patent [19]
Lee et al.

[11] Patent Number: 5,989,954
[45] Date of Patent: Nov. 23, 1999

[54] METHOD FOR FORMING A CYLINDER CAPACITOR IN THE DRAM PROCESS

[75] Inventors: Yu-Hua Lee, Hsinchu; Jenn Ming Huang, Chin-chu, both of Taiwan

[73] Assignee: Taiwan Semiconductor Manufacturing Company, Ltd., Hsin-Chu, Taiwan

[21] Appl. No.: 09/035,056

[22] Filed: Mar. 5, 1998

[51] Int. Cl.⁶ .............................................. H01L 21/8242
[52] U.S. Cl. .......................................... 438/253; 438/396
[58] Field of Search .................................. 438/239, 244, 438/250, 253, 256, 393, 396, 397, 399

[56] References Cited

U.S. PATENT DOCUMENTS

| | | | |
|---|---|---|---|
| 5,346,844 | 9/1994 | Cho et al. | 437/52 |
| 5,409,855 | 4/1995 | Jun | 437/52 |
| 5,554,557 | 9/1996 | Koh | 437/52 |
| 5,753,547 | 5/1998 | Ying | 438/253 |
| 5,854,119 | 12/1998 | Wu et al. | 438/396 |

OTHER PUBLICATIONS

Chang et al, "ULSI Technology", McGraw–Hill Companies, Inc. New York, NY, 1996, p. 444–445.

*Primary Examiner*—Charles Bowers
*Assistant Examiner*—Tark Chen
*Attorney, Agent, or Firm*—George O. Saile; Stephen B. Ackerman; Rosemary L.S. Pike

[57] ABSTRACT

A method for fabricating a cylindrical capacitor is described. Semiconductor device structures, including a capacitor node contact region, are formed on a semiconductor substrate. A first insulating layer is deposited over the device structures and planarized. A silicon nitride layer and then a second insulating layer are deposited over the first insulating layer. A contact opening having a first width is etched through the insulating layers and the silicon nitride layer to the capacitor node contact region. A photoresist mask is formed over the second insulating layer having a mask opening over the contact opening wherein the mask opening has a second width wider than the first width and wherein photoresist residue remains at the bottom of the contact opening. A second opening is etched in the second insulating layer corresponding to the mask opening wherein the photoresist residue protects the semiconductor substrate within the contact opening during etching. The photoresist mask and residue are removed. A first layer of polysilicon is deposited to fill the contact opening. The first polysilicon layer overlying the second insulating layer is polished away to form the bottom electrode of the capacitor. The second insulating layer is removed. A capacitor dielectric layer is deposited over the silicon nitride layer and the first polysilicon layer. A second polysilicon layer is deposited overlying the capacitor dielectric layer to form the top electrode of the capacitor.

34 Claims, 6 Drawing Sheets

METHOD FOR FORMING A CYLINDER CAPACITOR IN THE DRAM PROCESS

BACKGROUND OF THE INVENTION

(1). Field of the Invention

The present invention relates to a method of fabricating a dynamic random access memory device, and more particularly, to a method of forming a cylindrical capacitor in the fabrication of a dynamic random access memory device.

(2). Description of the Prior Art

Dynamic random access memory (DRAM) devices are widely used in the art. In recent years there has been a dramatic increase in the packing density of DRAMs. Large DRAM devices are normally silicon based, and each cell typically embodies a single MOS field effect transistor with its source connected to a storage capacitor. This large integration of DRAMs has been accomplished by a reduction in individual cell size. However, the reduction in cell size results in a decrease in storage capacitance leading to reliability drawbacks, such as a lowering of source/drain ratio and undesirable signal problems. In order to achieve the desired higher level of integration, the technology must keep almost the same storage capacitance on a greatly reduced cell area.

Efforts to maintain or increase the storage capacitance in memory cells with greater packing densities have included the use of a stacked cylindrical capacitor design in which the capacitor cell uses the space over the device area for the capacitor plates. In U.S. Pat. No. 5,346,844 to Cho et al, there is described a method of forming a cylindrical capacitor using a poly plug process. FIGS. 1 through 4 illustrate such a conventional poly plug process.

Referring to FIG. 1, there is illustrated a partially completed DRAM integrated circuit device in which is shown a semiconductor substrate 10. Semiconductor device structures, such as gate electrodes, not shown, are fabricated in and on the semiconductor substrate and covered with a thick oxide layer 15. A layer 17 of silicon nitride is deposited over the oxide layer. An opening is etched through the silicon nitride and oxide layers and filled with polysilicon which is etched back to form the poly plug 19. This opening is typically 0.3 to 0.35 microns wide. If the opening is too deep, it may be difficult to completely fill the opening. If the polysilicon is not etched back enough, polysilicon residue 21 may be left on the surface of the silicon nitride layer.

Referring now to FIG. 2, a second oxide layer 23 is deposited over the silicon nitride layer and the poly plug. A second photoresist mask is used to provide an opening having a width of between about 0.5 to 0.6 microns. The opening is etched through the second oxide layer 23 to the poly plug 19. A second polysilicon layer 27 is conformally deposited within the opening, as shown in FIG. 3, to form the bottom plate electrode of the capacitor.

If there is misalignment of the second photoresist mask 25, as shown in FIG. 4, the second polysilicon layer 27 does not completely cover the poly plug 19. Next, the polysilicon layer 27 is patterned, and the oxide layer 23 is stripped. If there is misalignment, as in FIG. 4, the portion of the poly plug 33 not covered by the polysilicon layer 27 will be exposed. This is a weak point. The oxide etch, such as buffered oxide etch (BOE) will etch through the weak point 33 and cause peeling of the silicon nitride layer 17 at that point.

Metal plug processes are discussed in ULSI Technology, by Chang and Sze, McGraw-Hill, New York, N.Y., c. 1996, pp. 444–445. U.S. Pat. Nos. 5,409,855 to Jun and 5,554,557 to Koh teach methods of forming cylindrical capacitors without using a poly plug process, but do not address the misalignment and deep recess problems.

SUMMARY OF THE INVENTION

Accordingly, it is a primary object of the invention to provide an effective and very manufacturable process for producing a memory cell capacitor.

Another object of the present invention is to provide a method for fabricating a cylindrical capacitor without forming a polysilicon plug.

Yet another object is to provide a method for fabricating a cylindrical capacitor which is not effected by a mask misalignment.

In accordance with the objects of this invention, a method for fabricating a cylindrical capacitor is achieved. Semiconductor device structures, including a capacitor node contact region, are formed in and on a semiconductor substrate. A capacitor is formed using the following steps. A first insulating layer is deposited overlying the semiconductor device structures and planarized. A silicon nitride layer is deposited overlying the first insulating layer. A second insulating layer is deposited overlying the silicon nitride layer. A contact opening is etched through the first and second insulating layers and the silicon nitride layer to the capacitor node contact region wherein the contact opening has a first width. A photoresist mask is formed overlying the second insulating layer and having a mask opening over the contact opening wherein the mask opening has a second width wider than the first width and wherein photoresist residue remains at the bottom of the contact opening. A second opening is etched in the second insulating layer corresponding to the mask opening wherein the photoresist residue protects the semiconductor substrate within the contact opening during etching. The photoresist mask and residue are removed. A first layer of polysilicon is deposited overlying the second insulating layer and filling the contact opening. The first polysilicon layer overlying the second insulating layer is polished away to form the bottom electrode of the capacitor. The second insulating layer is removed. A capacitor dielectric layer is deposited over the silicon nitride layer and the first polysilicon layer. A second polysilicon layer is deposited overlying the capacitor dielectric layer to form the top electrode of the capacitor to complete formation of a DRAM with capacitor.

BRIEF DESCRIPTION OF THE DRAWINGS

In the following drawings forming a material part of this description, there is shown.

DESCRIPTION OF THE PREFERRED EMBODIMENTS

Figure 1:
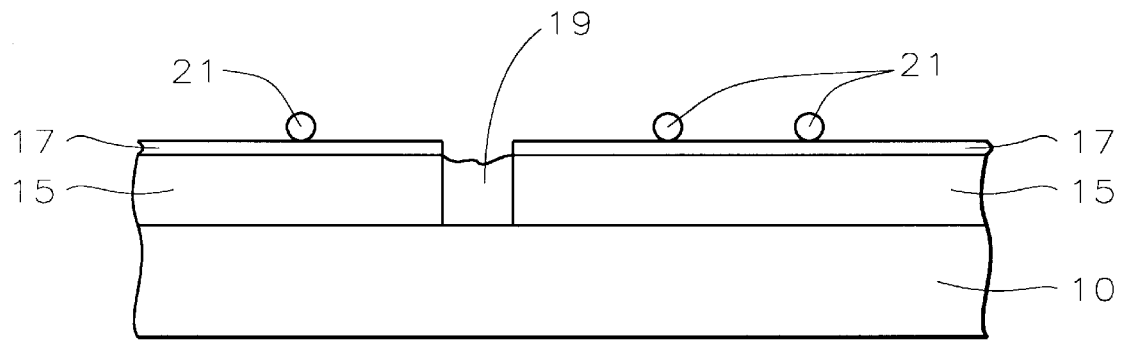
FIGS. 1 through 4 are schematic cross-sectional representations of a process of the prior art.
Figure 2:
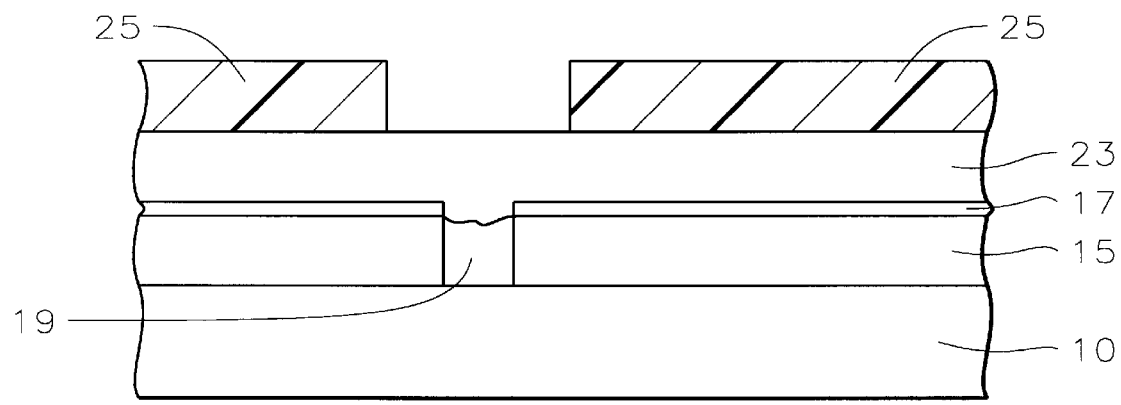
Figure 3:
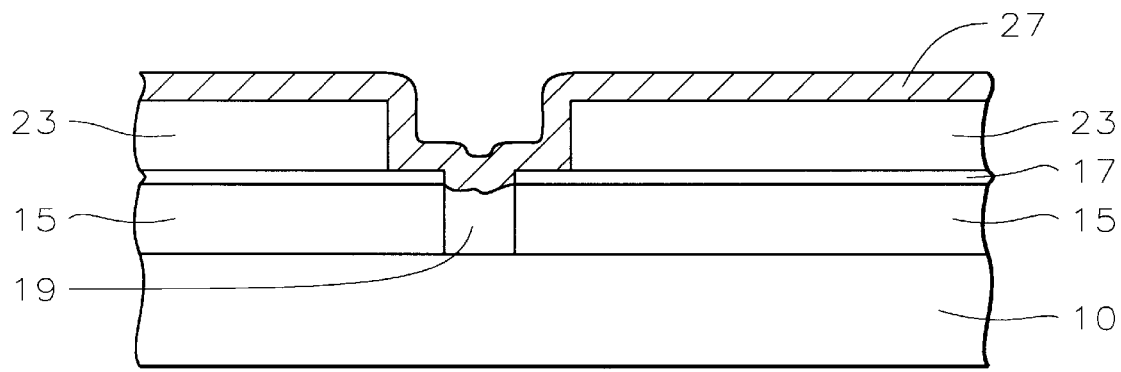
Figure 4:
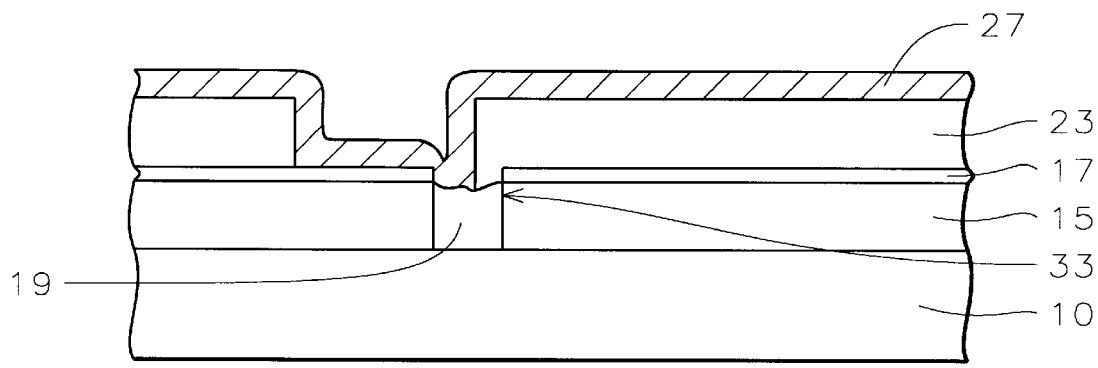
Figure 5:
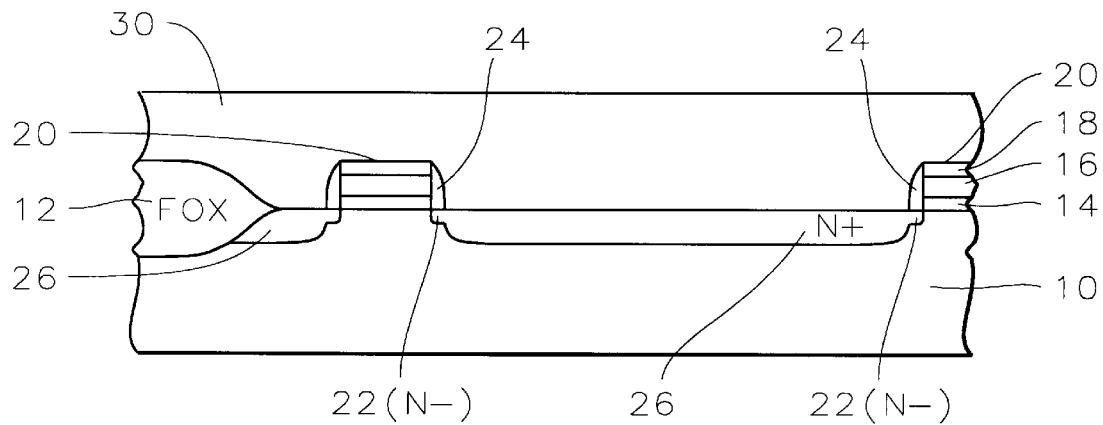
FIGS. 5 through 14 are schematic cross-sectional representations of a preferred embodiment of the present invention.

Referring now more particularly to FIG. 5, the first series of steps involves the formation of the dielectric isolation regions for isolating semiconductor surface regions from other such regions in the semiconductor substrate 10. The semiconductor substrate is preferably composed of silicon having a (100) crystallographic orientation. In an effort to simplify the description and the drawings the dielectric isolation between devices has been only partially shown and will not be described in detail, because they are conventional. Field oxide regions 12 are formed in and on the semiconductor substrate.

The surface of the silicon substrate 10 is thermally oxidized to form the desired gate oxide 14 thickness. The preferred thickness is between about 80 to 200 Angstroms. The polysilicon layer 16 is blanket deposited by low pressure chemical vapor deposition (LPCVD) to a preferred thickness of between about 1500 to 3500 Angstroms. A layer 18 of silicon oxide is chemically vapor deposited over the surface of the polysilicon to a thickness of between about 600 to 1200 Angstroms. The layers 14, 16, and 18 are patterned by lithography and anisotropic etching techniques as are conventional in the art to provide a desired pattern of gate electrodes and word lines 20 as seen in FIG. 5.

The source/drain structure of the MOS FET may now be formed by the following steps. FIGS. 5 through 10 illustrate the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate. As is understood in the art, the DRAM cell is composed of a combination device structure of an N channel FET and a stacked capacitor while the peripheral circuits are often composed of CMOS devices.

Lightly doped source and drain regions 22 are formed by ion implantation. The dielectric spacer 24 is now to be formed followed by the completion of the lightly doped drain source/drain structures. A tetraethoxysilane (TEOS) oxide LPCVD deposition is preferred to a thickness of between about 1000 to 2000 Angstroms. An anisotropic etching of this layer produces the dielectric spacer layer 24 on the sidewalls of the layer structures 20. The heavily doped source and drain regions 26 are formed by ion implantation, as conventional in the art.

A thick insulating layer, such as chemically vapor deposited (CVD) silicon oxide or 30 is deposited to a thickness of between about 5000 to 10,000 Angstroms and then planarized, for example by chemical mechanical polishing (CMP), to obtain a flat surface.

Figure 6:
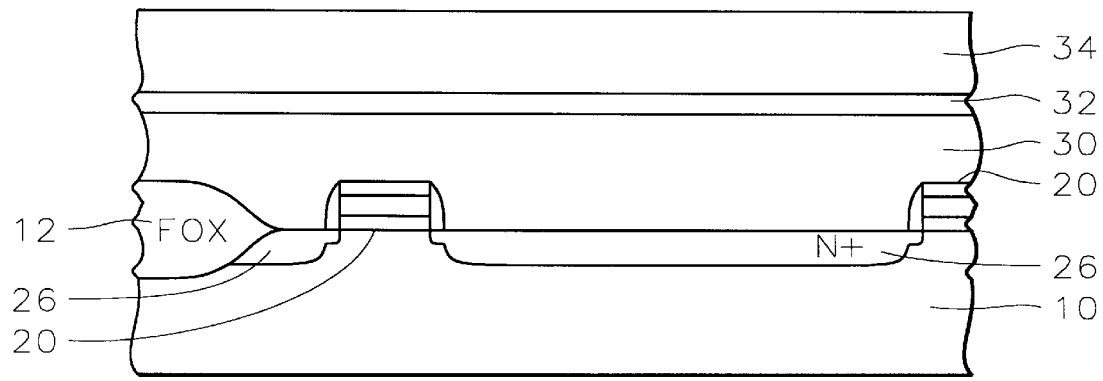

Referring now to FIG. 6, a layer of silicon nitride 32 is deposited over the silicon oxide layer 30 to a thickness of between about 200 and 2000 Angstroms. A second layer of silicon oxide 34 is deposited over the silicon nitride layer to a thickness of between about 2000 and 5000 Angstroms. The layer 34 is of the same material as layer 30.

Figure 7:
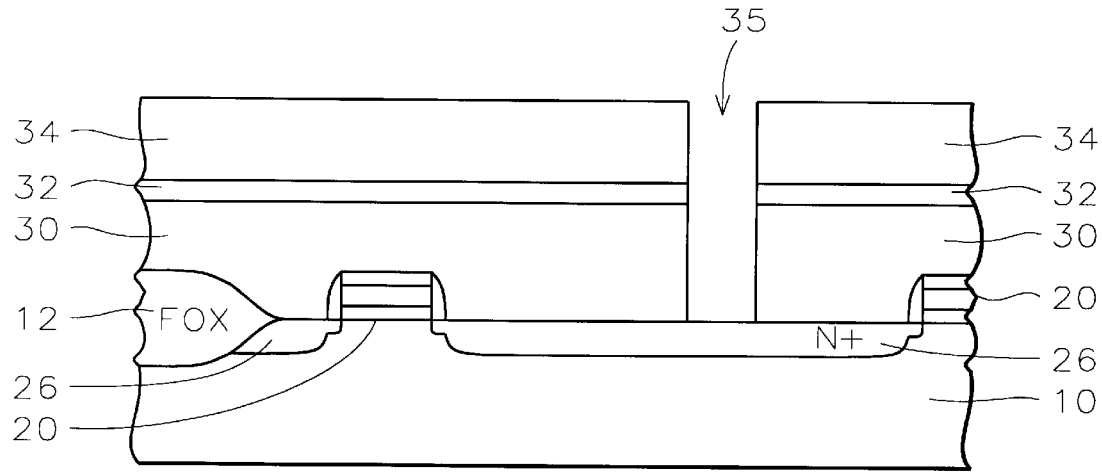

Referring now to FIG. 7, using conventional lithographic and etching techniques, a contact opening 35 is made through the oxide and silicon nitride layers 34, 32, and 30 to the silicon substrate. Source/drain region 26 will serve as the node contact region for the capacitor structure.

Figure 8:
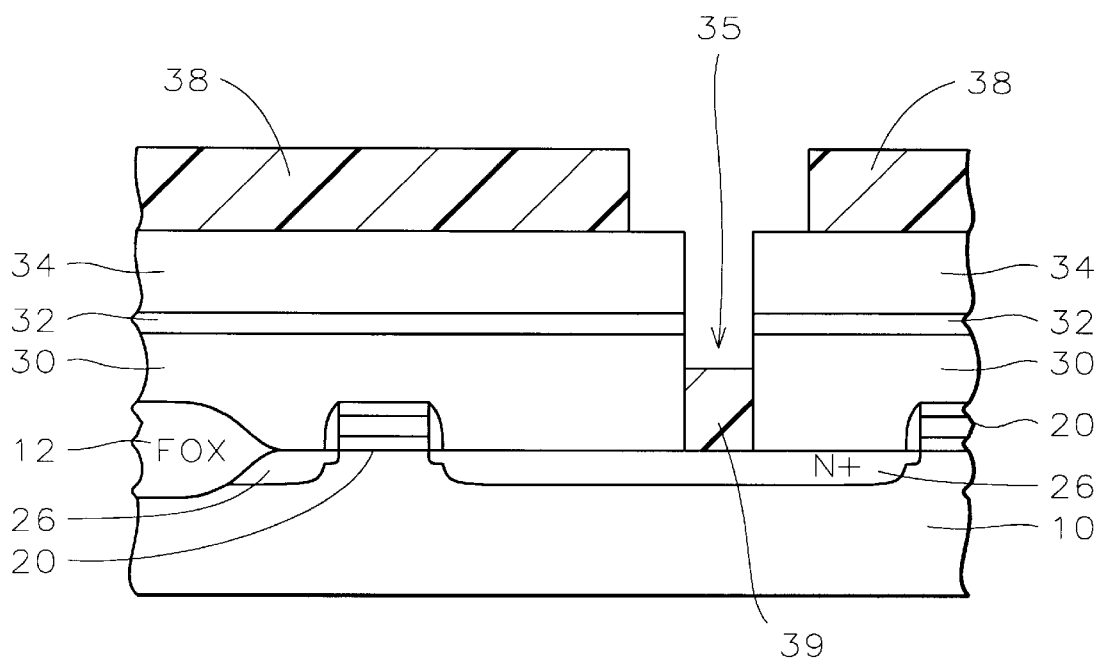

Referring now to FIG. 8, a key feature of the present invention will be described. A layer of photoresist is coated over the surface of the substrate and patterned to form the photoresist mask 38. Photoresist residue 39 at the bottom of the contact opening 35 will protect the semiconductor substrate during etching.

The oxide layer 34 is etched away where it is not covered by the photoresist mask 38 to form the opening 37 for the capacitor structure. The silicon nitride layer 32 acts as an etch stop layer during etching of the silicon oxide layer 34.

Figure 9:
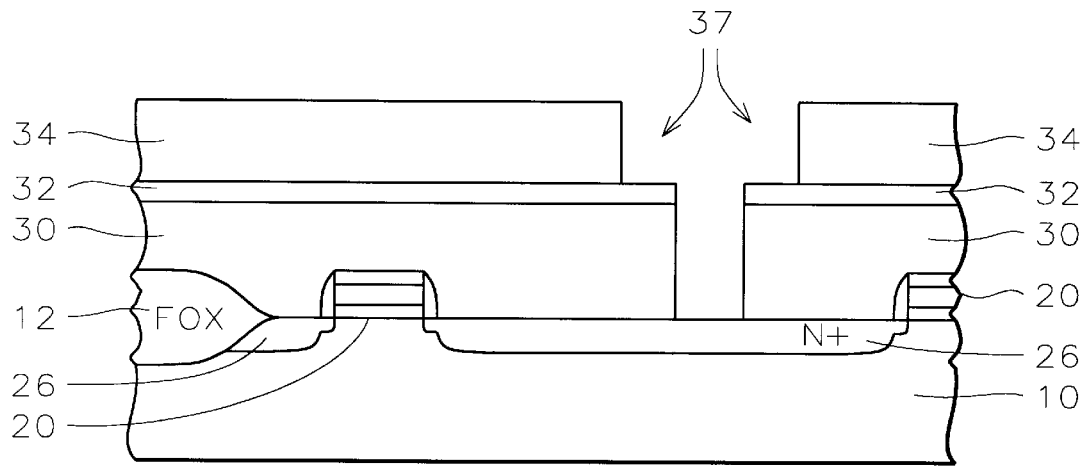

The photoresist mask 38 and the photoresist residue 39 within the opening 35 are removed using a conventional photoresist strip. The resulting structure is illustrated in FIG. 9.

Figure 10:
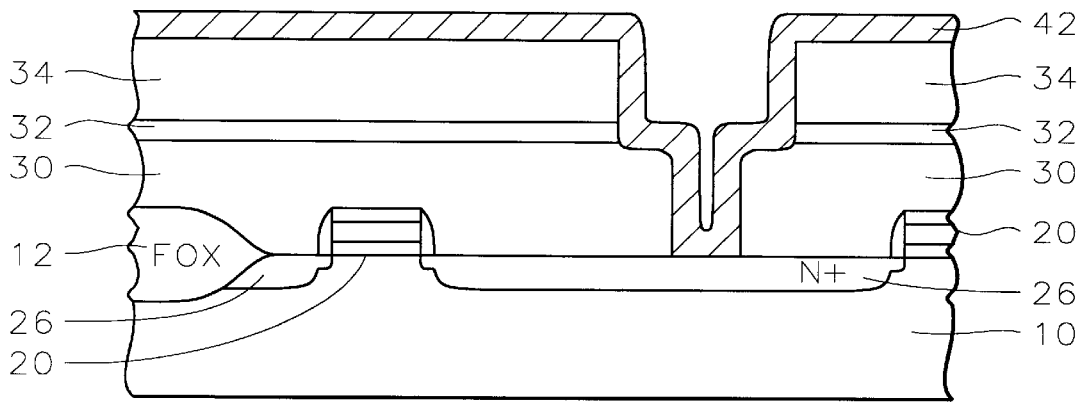

A first polysilicon layer 42 is deposited over oxide layer 34 and within the openings 37 and 35, as illustrated in FIG. 10. The polysilicon layer may be in situ doped or doped after deposition by ion implantation. The thickness of this layer is between about 1000 and 3000 Angstroms.

Figure 11:
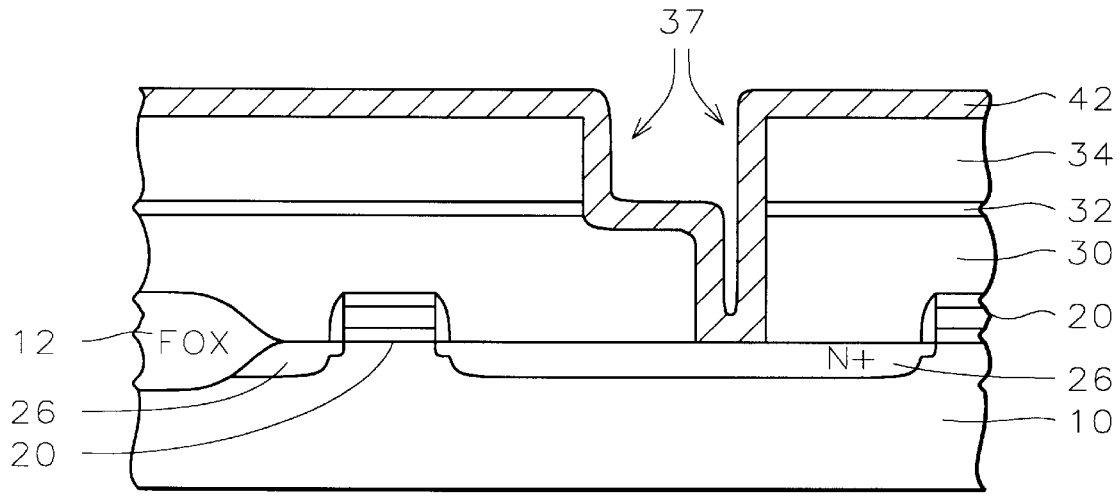

If the photoresist mask 38 of FIG. 8 is misaligned, the opening 37 will be misaligned as illustrated in FIG. 11. However, this misalignment causes no problems. Since the oxide layer 30 has already been etched to the width of the contact opening 35 and the opening has not been filled with a poly plug, a misalignment could not cause an overhang of the oxide layer 30 over the opening 35.

Figure 12:
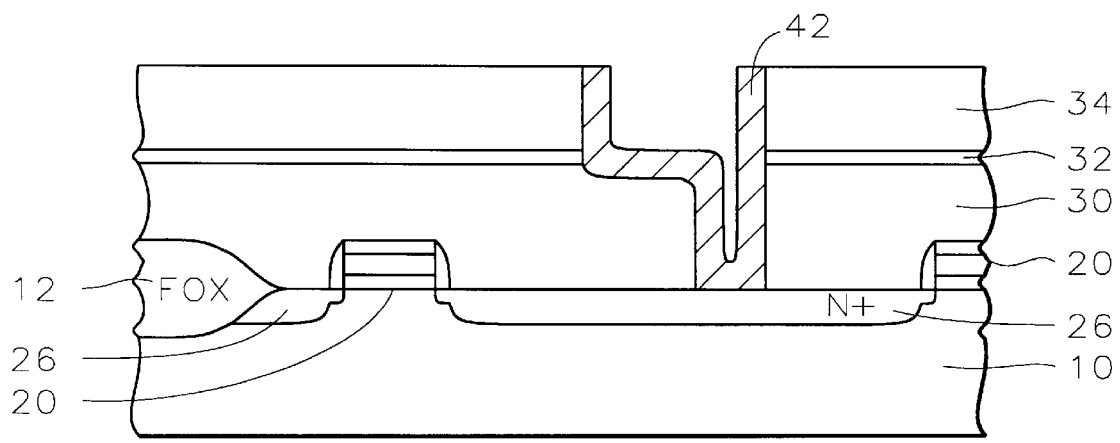

Referring now to FIG. 12, the wafer surface is planarized, such as by CMP with a polish stop at the oxide layer 34. The polysilicon layer 42 remaining forms the bottom electrode of the capacitor.

Figure 13:
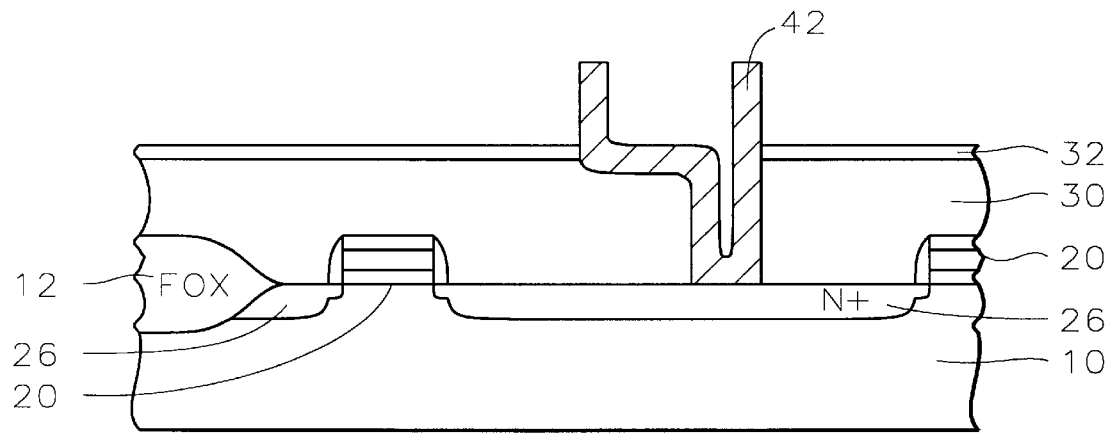
Figure 14:
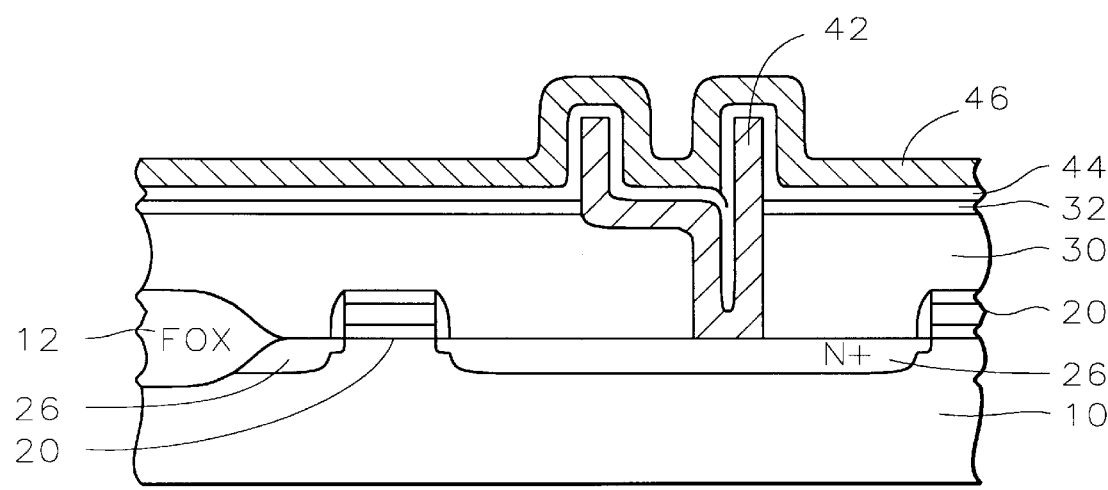

Referring now to FIG. 13, the oxide layer 34 is stripped, for example, using a buffered oxide etch (BOE). Then, as shown in FIG. 14, a capacitor dielectric layer 44 is deposited conformally over the polysilicon 42 and silicon nitride layer 32 surfaces. This layer is typically either composed of layers of silicon nitride and silicon oxide (NO) or layers of silicon oxide, silicon nitride and silicon oxide (ONO). The total ONO thickness is in the order of between about 45 to 100 Angstroms.

The top plate electrode is formed by depositing a second polysilicon layer 46 by LPCVD. The thickness of this layer 46 is between about 500 to 2000 Angstroms. The polysilicon layer 46 is in-situ doped or doped after deposition. The polysilicon and capacitor dielectric layers are patterned as required to isolate the metal contact in another part of the substrate, not shown in this view.

The process of the invention results in a cylindrical DRAM capacitor having no residue or misalignment problems. The process of the invention is a simple and easily controlled process with fewer processing steps than the conventional poly plug process.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a dynamic random access memory (DRAM) having a capacitor comprising:

forming device structures within device areas of a semiconductor substrate wherein said device structures include a capacitor node contact region within said semiconductor substrate; and forming said capacitor by:

depositing a first insulating layer overlying said device structures and planarizing said first insulating layer;

depositing a silicon nitride layer overlying said first insulating layer;

depositing a second insulating layer overlying said silicon nitride layer;

forming a contact opening by etching through said first and second insulating layers and said silicon nitride layer to said capacitor node contact region wherein said contact opening has a first width;

forming a photoresist mask overlying said second insulating layer and having a mask opening over said contact opening wherein said mask opening has a second width wider than said first width and wherein a photoresist residue remains at the bottom of said contact opening;

forming an upper opening by etching said second insulating layer corresponding to said mask opening wherein said photoresist residue protects said semiconductor substrate within said contact opening during said etching;

thereafter removing said photoresist mask and said photoresist residue;

depositing a first polysilicon layer overlying said second insulating layer and filling said contact opening;

polishing away said first polysilicon layer overlying said second insulating layer to form a bottom electrode of said capacitor;

thereafter removing said second insulating layer;

depositing a capacitor dielectric layer over said silicon nitride layer and said first polysilicon layer; and depositing a second polysilicon layer overlying said capacitor dielectric layer wherein said second polysilicon layer forms a top electrode of said capacitor to complete formation of said DRAM with capacitor.

2. The method according to claim 1 wherein said device structures include source/drain and gate field effect transistor structures which form a dynamic random access memory cell together with said capacitor.

3. The method according to claim 1 wherein said first insulating layer comprises chemically vapor deposited silicon oxide and has a thickness of between about 5000 and 10,000 Angstroms.

4. The method according to claim 1 wherein said first insulating layer is planarized by chemical mechanical polishing.

5. The method according to claim 1 wherein said silicon nitride layer has a thickness of between about 200 and 2000 Angstroms.

6. The method according to claim 1 wherein said second insulating layer comprises chemically vapor deposited silicon oxide and has a thickness of between about 2000 and 5000 Angstroms.

7. The method according to claim 1 wherein said first width is between about 0.3 and 0.35 microns.

8. The method according to claim 1 wherein said second width is between about 0.5 and 0.6 microns.

9. The method according to claim 1 wherein said first polysilicon layer has a thickness of between about 1000 and 3000 Angstroms.

10. The method according to claim 1 wherein said capacitor dielectric layer is composed of layers of silicon oxide, silicon nitride, and silicon oxide having a combined thickness of between about 45 and 100 Angstroms.

11. The method according to claim 1 wherein said capacitor dielectric layer is composed of layers of silicon nitride and silicon oxide.

12. The method according to claim 1 wherein said second polysilicon layer has a thickness of between about 500 and 2000 Angstroms.

13. A method for fabricating a dynamic random access memory (DRAM) having a capacitor comprising:

forming device structures within device areas of a semiconductor substrate wherein said device structures include a capacitor node contact region within said semiconductor substrate; and forming said capacitor by:
depositing a first insulating layer overlying said device structures and planarizing said first insulating layer;
depositing a silicon nitride layer overlying said first insulating layer;
depositing a second insulating layer overlying said silicon nitride layer;
forming a contact opening by etching through said first and second insulating layers and said silicon nitride layer to said capacitor node contact region wherein said contact opening has a first width;
forming a photoresist mask overlying said second insulating layer and having a mask opening over said contact opening wherein said mask opening has a second width wider than said first width and wherein a photoresist residue remains at the bottom of said contact opening;
forming an upper opening by etching said second insulating layer corresponding to said mask opening wherein said photoresist residue protects said semiconductor substrate within said contact opening during said etching;
thereafter removing said photoresist mask and said photoresist residue;
depositing a first polysilicon layer overlying said second insulating layer and filling said contact opening;
polishing away said first polysilicon layer overlying said second insulating layer leaving said first polysilicon layer within said contact opening and on the sidewalls of said upper opening wherein said first polysilicon layer remaining forms a bottom electrode of said capacitor;
thereafter removing said second insulating layer;
depositing a capacitor dielectric layer over said silicon nitride layer and said first polysilicon layer; and
depositing a second polysilicon layer overlying said capacitor dielectric layer wherein said second polysilicon layer forms a top electrode of said capacitor to complete formation of said DRAM with capacitor.

14. The method according to claim 13 wherein said device structures include source/drain and gate field effect transistor structures which form a dynamic random access memory cell together with said capacitor.

15. The method according to claim 13 wherein said first insulating layer comprises chemically vapor deposited silicon and has a thickness of between about 5000 and 10,000 Angstroms.

16. The method according to claim 13 wherein said first insulating layer is planarized by chemical mechanical polishing.

17. The method according to claim 13 wherein said silicon nitride layer has a thickness of between about 200 and 2000 Angstroms.

18. The method according to claim 13 wherein said second insulating layer comprises chemically vapor deposited silicon and has a thickness of between about 2000 and 5000 Angstroms.

19. The method according to claim 13 wherein said first width is between about 0.3 and 0.35 microns.

20. The method according to claim 13 wherein said second width is between about 0.5 and 0.6 microns.

21. The method according to claim 13 wherein said first polysilicon layer has a thickness of between about 1000 and 3000 Angstroms.

22. The method according to claim 13 wherein said capacitor dielectric layer is composed of layers of silicon oxide, silicon nitride, and silicon oxide having a combined thickness of between about 45 and 100 Angstroms.

23. The method according to claim 13 wherein said capacitor dielectric layer is composed of layers of silicon nitride and silicon oxide.

24. The method according to claim 13 wherein said second polysilicon layer has a thickness of between about 500 and 2000 Angstroms.

25. A method for fabricating a dynamic random access memory (DRAM) having a capacitor comprising:

forming field oxide regions on a semiconductor substrate;

forming a gate silicon oxide layer over a surface of said semiconductor substrate;

depositing a gate polysilicon layer overlying said gate silicon oxide layer and patterning said gate polysilicon to form gate electrodes;

forming lightly doped drain regions within said semiconductor substrate;

depositing and etching a spacer silicon oxide layer to form spacers on the sidewalls of said gate electrodes;

forming source and drain regions within said semiconductor substrate; and forming said capacitor by:

depositing a first insulating layer overlying said semiconductor substrate and said gate electrodes and planarizing said first insulating layer;

depositing a silicon nitride layer overlying said first insulating layer;

depositing a second insulating layer overlying said silicon nitride layer;

forming a contact opening by etching through said first and second insulating layers and said silicon nitride layer to one of said source and drain regions which will form a capacitor node contact region wherein said contact opening has a first width;

forming a photoresist mask overlying said second insulating layer and having a mask opening over said contact opening wherein said mask opening has a second width wider than said first width and wherein a photoresist residue remains at the bottom of said contact opening;

forming an upper opening by etching said second insulating layer corresponding to said mask opening wherein said photoresist residue protects said semiconductor substrate within said contact opening during said etching;

thereafter removing said photoresist mask and said photoresist residue;

depositing a first polysilicon layer overlying said second insulating layer and filling said contact opening;

polishing away said first polysilicon layer overlying said second insulating layer to form a bottom electrode of said capacitor;

thereafter removing said second insulating layer;

depositing a capacitor dielectric layer over said silicon nitride layer and said first polysilicon layer; and depositing a second polysilicon layer overlying said capacitor dielectric layer wherein said second polysilicon layer forms a top electrode of said capacitor to complete formation of said DRAM with capacitor.

26. The method according to claim 25 wherein said first insulating layer comprises chemically vapor deposited silicon oxide and has a thickness of between about 5000 and 10,000 Angstroms.

27. The method according to claim 25 wherein said first insulating layer is planarized by chemical mechanical polishing.

28. The method according to claim 25 wherein said silicon nitride layer has a thickness of between about 200 and 2000 Angstroms.

29. The method according to claim 25 wherein said second insulating layer comprises chemically vapor deposited silicon oxide and has a thickness of between about 2000 and 5000 Angstroms.

30. The method according to claim 25 wherein said first width is between about 0.3 and 0.35 microns.

31. The method according to claim 25 wherein said second width is between about 0.5 and 0.6 microns.

32. The method according to claim 25 wherein said first polysilicon layer has a thickness of between about 1000 and 3000 Angstroms.

33. The method according to claim 25 wherein said capacitor dielectric layer is composed of layers of silicon oxide, silicon nitride, and silicon oxide having a combined thickness of between about 45 and 100 Angstroms.

34. The method according to claim 25 wherein said second polysilicon layer has a thickness of between about 500 and 2000 Angstroms.

* * * * *